(12) United States Patent  
Cheng et al.

(10) Patent No.: US 11,848,198 B2  
(45) Date of Patent: Dec. 19, 2023

(54) METHOD FOR MANUFACTURING SEMICONDUCTOR DEVICE HAVING LOW-K CARBON-CONTAINING DIELECTRIC LAYER

(71) Applicant: TAIWAN SEMICONDUCTOR MANUFACTURING COMPANY, LTD., Hsinchu (TW)

(72) Inventors: Kai-Fang Cheng, Hsinchu (TW); Ting-Ya Lo, Hsinchu (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 123 days.

(21) Appl. No.: 17/460,798

(22) Filed: Aug. 30, 2021

(65) Prior Publication Data

US 2023/0066228 A1    Mar. 2, 2023

(51) Int. Cl.
*H01L 21/02* (2006.01)
*H01L 21/768* (2006.01)
*H01L 21/311* (2006.01)

(52) U.S. Cl.
CPC .. *H01L 21/02115* (2013.01); *H01L 21/31138* (2013.01); *H01L 21/76832* (2013.01)

(58) Field of Classification Search
None
See application file for complete search history.

(56) References Cited

U.S. PATENT DOCUMENTS

2009/0239390 A1*  9/2009  Wu ............... H01L 21/02348
                                    257/E21.26
2020/0006126 A1*  1/2020  Liou ............. H01L 21/76877

OTHER PUBLICATIONS

Huang et al, CN 112992856A, Semiconductor Structure, Jun. 18, 2021. (Year: 2021).*

* cited by examiner

Primary Examiner — Alexander G Ghyka
(74) Attorney, Agent, or Firm — Birch, Stewart, Kolasch & Birch, LLP

(57) ABSTRACT

A method for manufacturing a semiconductor device having a low-k carbon-containing dielectric layer includes: depositing a low-k carbon-containing dielectric material, which has a carbon content ranging from 16 atomic % to 23 atomic %, using a precursor mixture to form a carbon-containing dielectric layer having a k value ranging from 2.8 to 3.3 and a porosity ranging from 0.03% to 1.0%; forming the carbon-containing dielectric layer into a patterned carbon-containing dielectric layer having a recess therein by etching, the patterned carbon-containing dielectric layer having a porosity ranging from 1.0% to 2.0%; and filling the recess with an electrically conductive material to form an electrically conductive feature in the patterned carbon-containing dielectric layer.

20 Claims, 9 Drawing Sheets

METHOD FOR MANUFACTURING SEMICONDUCTOR DEVICE HAVING LOW-K CARBON-CONTAINING DIELECTRIC LAYER

BACKGROUND

The integration density of various electronic components, such as transistors, diodes, resistors, capacitors, etc., is being improved continuously in the semiconductor industry by continual reduction in minimum feature sizes. As the feature sizes are decreased, the distance between metal features is continually reduced. As the distance between the metal features reduces, the resulting parasitic capacitance between the metal features increases, leading to higher power consumption and larger resistance-capacitance (RC) time delays for an integrated chip. To improve performance and reduce the parasitic capacitance between the metal features, a low-k dielectric material is used for forming an interlayer dielectric (ILD) layer.

However, the ILD layer made of the low-k dielectric material may have a high porosity which may result in etch damage during or after an etching process, such as a dry etching process, and thus may lead to significantly increasing leakage and significantly deceasing electric field breakdown voltage (Ebd).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
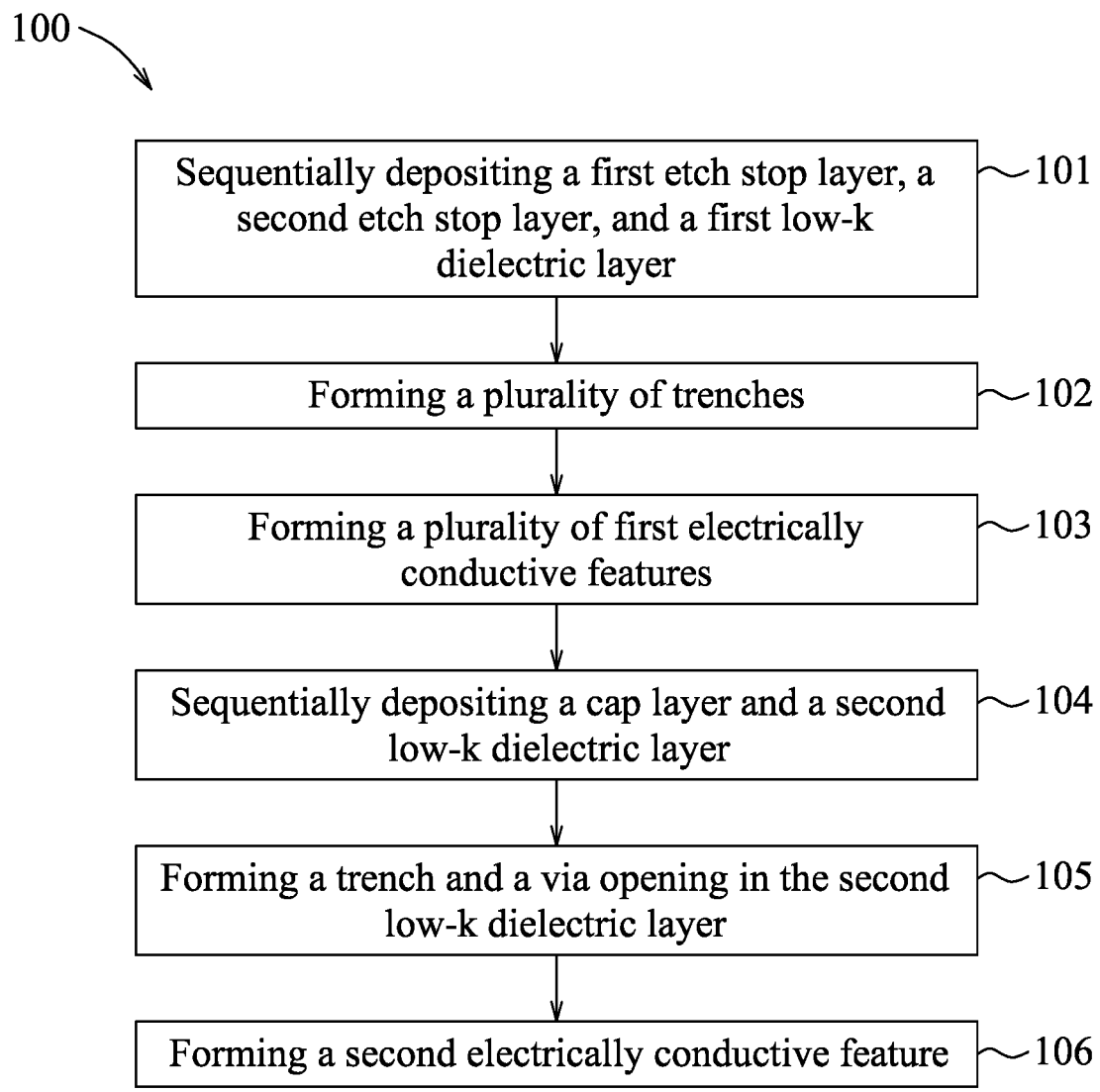
FIG. 1 is a flow diagram illustrating a method for manufacturing a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a method 100 for manufacturing a semiconductor device in accordance with some embodiments. FIGS. 2 to 7 illustrate schematic views of a semiconductor device 1 during various stages of the method 100 of FIG. 1. The method 100 and the semiconductor device 1 are collectively described below. However, additional steps can be provided before, after or during the method 100, and some of the steps described herein may be replaced by other steps or may be eliminated. Similarly, further additional features may be present in the semiconductor device 1, and/or features present may be replaced or eliminated in additional embodiments.

Referring to FIG. 1, the method 100 begins at block 101, where a first etch stop layer, a second etch stop layer, and a first low-k dielectric layer are sequentially deposited over a semiconductor substrate. Referring to the example illustrated in FIG. 2, a first etch stop layer 13, a second etch stop layer 14, and a first low-k dielectric layer 15 are sequentially deposited over a semiconductor substrate 10.

In some embodiments, the semiconductor substrate 10 may include, for example but not limited to, an elemental semiconductor or a compound semiconductor. The elemental semiconductor includes a single species of atoms, such as silicon (Si) or germanium (Ge) in column IV of the periodic table. Other suitable materials are within the contemplated scope of the present disclosure. The compound semiconductor includes two or more elements, and examples thereof may include, for example but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location in the compound semiconductor. The compound semiconductor may be formed over a silicon substrate. The compound semiconductor may be strained. In some embodiments, the semiconductor substrate 10 may include a multilayer compound semiconductor structure. In some embodiments, the semiconductor substrate 10 may be a semiconductor on insulator (SOI) (e.g., silicon germanium on insulator (SGOI)). Generally, the SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example but not limited to, boron (Br), aluminum (Al), or gallium (Ga). Other suitable materials are within the contemplated scope of the present disclosure. Alternatively, the SOI substrate may be doped with an N-type dopant, for example but not limited to, nitrogen (N), phosphorous (P), or arsenic (As). Other suitable materials are within the contemplated scope of the present disclosure. Shallow trench isolation (STI) regions (not shown) may be formed in the semiconductor substrate 10 to isolate active regions (one is schematically shown in FIG. 1 with the numeral 11), such as source or drain regions of an integrated circuit device (not shown) in the semiconductor substrate 10. In some embodiments, the integrated circuit device may include, for example but not limited to, complementary metal-oxide semiconductor (CMOS) transistors, planar or vertical multi-gate transistors (e.g., fin field-effect transistor (FinFET) devices), gate-all-around (GAA) devices, resistors, capacitors, diodes, other transistors (e.g., FETs), and interconnections, based on practical applications. In addition, through-vias (not shown) may be formed to extend into the semiconductor substrate 10 for electrically connecting features on opposite sides of the semiconductor substrate 10. The active region 11 in the semiconductor substrate 10 is electrically connected to a metal line in a metal layer (not shown) through a via contact 12.

The first etch stop layer 13 may include, for example but not limited to, silicon oxide (SiOx), silicon nitride (SiNx), silicon carbide (SiCx), silicon oxycarbide (SiOxCy), silicon oxynitride (SiOxNy), silicon carbonitride (SiCxNy), and/or silicon oxycarbonitride (SiOxCyNz). Other suitable materials are within the contemplated scope of the present disclosure. Deposition of the first etch stop layer 13 may be performed by a suitable deposition process as is known to those skilled in the art of semiconductor fabrication, for example but not limited to, chemical vapor deposition (CVD), plasma-enhanced chemical vapor deposition (PECVD), atomic layer deposition (ALD), or plasma-enhanced atomic layer deposition (PEALD). The first etch stop layer 13 may have a thickness ranging from about 1 Å to about 100 Å.

The second etch stop layer 14 may include, for example but not limited to, silicon oxide, silicon nitride, silicon carbide, silicon oxycarbide, silicon oxynitride, silicon carbonitride, silicon oxycarbonitride, aluminum oxide (AlOx), aluminum nitride (AlNx), aluminum oxynitride (AlOxNy), hafnium oxide (HfOx), hafnium zirconium oxide (HfZrO), hafnium silicon oxide (HfSiO), hafnium silicon oxynitride (HfSiON), zirconium silicon oxide (ZrSiO), hafnium zirconium silicon oxide (HfZrSiO), hafnium aluminum oxide (HfAlO), hafnium aluminum nitride (HfAlN), zirconium aluminum oxide (ZrAlO), ytterbium oxide (YbOx), tantalum nitride (TaNx), tantalum silicon nitride (TaSiN), tantalum oxide (TaOx), tantalum silicon oxide (TaSiO), titanium nitride (TiNx), titanium silicon nitride (TiSiN), titanium oxide (TiOx), and/or titanium silicon oxide (TiSiO). Other suitable materials are within the contemplated scope of the present disclosure. Deposition of the second etch stop layer 14 may be performed by a suitable deposition process as is known to those skilled in the art of semiconductor fabrication, for example but not limited to, CVD, PECVD, ALD, or PEALD. The second etch stop layer 14 may have a thickness ranging from about 1 Å to about 100 Å.

Figure 4:
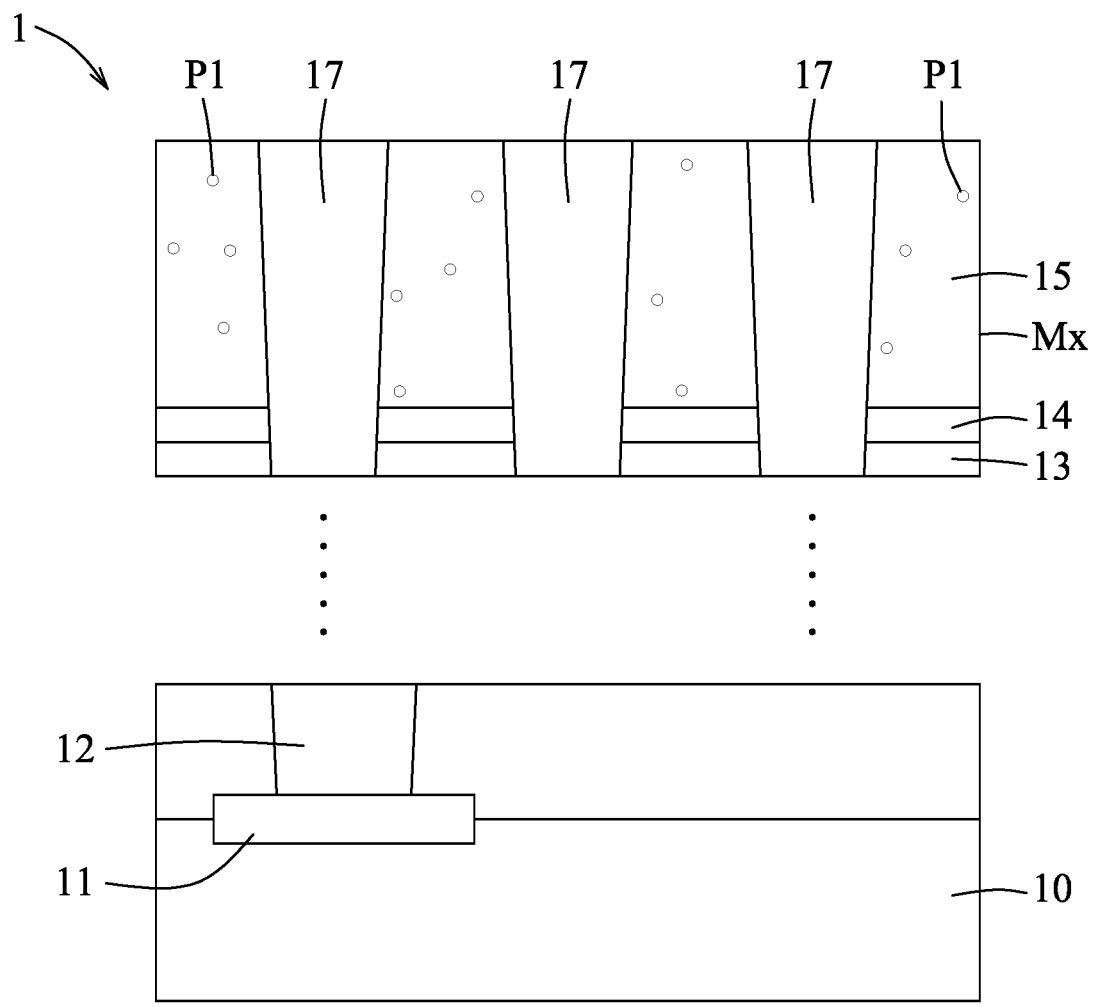

The first low-k dielectric layer 15 is used as an ILD layer in a first damascene process (a single damascene process) for forming a first interconnect structure (i.e., a metal layer (Mx) as shown in FIG. 4), and may include a low-k dielectric material which generally has a dielectric constant (k value) ranging from of less than about 3.5. In some embodiments, the low-k dielectric material may include, for example but not limited to, a carbon-containing dielectric material. In some embodiments, the carbon-containing dielectric material may include, for example but not limited to, a carbon-containing silicon oxide dielectric material. Deposition of the first low-k dielectric layer 15 may be performed by a suitable deposition process as is known to those skilled in the art of semiconductor fabrication, for example but not limited to, CVD, PECVD, ALD, PEALD, or spin-coating. Deposition of the first low-k dielectric layer 15 may be performed at a temperature ranging from room temperature to about 400° C. The first low-k dielectric layer 15 may have a thickness ranging from about 10 Å to about 5000 Å. In some embodiments, the first low-k dielectric layer 15 may be further treated by an ultraviolet (UV) curing process so as to improve the mechanical properties of the first low-k dielectric layer 15.

Referring to FIG. 1, the method 100 then proceeds to block 102 where a plurality of trenches are formed, and then proceeds to block 103 where a plurality of first electrically conductive features are formed. Referring to the examples illustrated in FIGS. 3 and 4, the single damascene process is then performed to form the first interconnect structure (i.e., the metal layer (Mx)).

Figure 3:
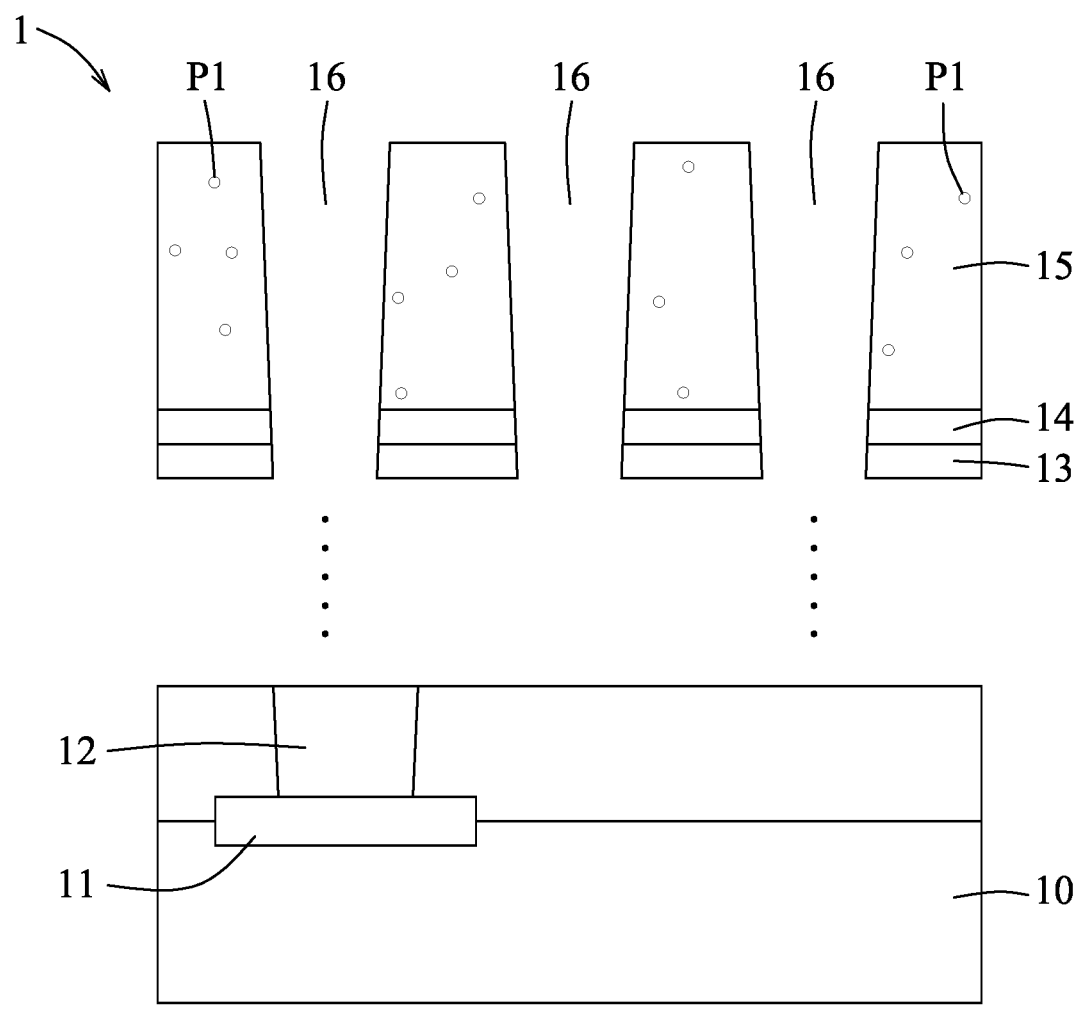

Specifically referring to the example illustrated in FIG. 3, a plurality of recesses (trenches 16) are formed to extend through the first low-k dielectric layer 15, the second etch stop layer 14, and the first etch stop layer 13. The trenches 16 may be formed by patterning the first low-k dielectric layer 15, the second etch stop layer 14, and the first etch stop layer 13 using one or more etching processes (for example but not limited to, a dry etching process) through a pattern opening of a patterned mask layer (not shown).

Specifically referring to the examples illustrated in FIGS. 3 and 4, the trenches 16 is filled with a first electrically conductive material to form a plurality of first electrically conductive features 17, such as electrically conductive metal lines in the metal layer (Mx).

In some embodiments, the first electrically conductive material may include, for example but not limited, copper (Cu), aluminum (Al), gold (Au), silver (Ag), tungsten (W), cobalt (Co), ruthenium (Ru), iridium (Ir), platinum (Pt), nickel (Ni), palladium (Pd), osmium (Os), etc., and alloys thereof, which have good conductive performances. Other suitable materials are within the contemplated scope of the present disclosure. The first electrically conductive material may be provided as multiple layers having varying composition, and the trenches 16 may be filled therewith by a suitable process as is known in the art of semiconductor fabrication, for example but not limited to, ALD, CVD, physical vapor deposition (PVD), electroless deposition (ELD), or electro-chemical plating (ECP). In some embodiments, the process for filling the trenches 16 with the first electrically conductive material may be performed at a temperature ranging from about 200° C. to about 425° C.

While the first electrically conductive material may be a suitable metal or an alloy thereof as described above, the method of the present disclosure is particularly adapted to the use of Cu. Electroless plating of copper generally includes forming a seed layer followed by autocatalytic copper deposition. Examples of the material for the seed layer may include, for example but not limited to, Cu, Ni, Au, Ag, Pd, Ir, nickel-palladium-gold (NiPdAu), and nickel-gold (NiAu). Other suitable materials are within the contemplated scope of the present disclosure. The seed layer can be formed by a suitable process as is known in the art of semiconductor fabrication, for example but not limited to, electroless deposition or sputtering. Before filling the trenches 16 with copper or the like, the trenches 16 may be lined with a barrier layer that prevents electromigration. Examples of materials for the barrier layer may include, for example but not limited to, Ru, manganese (Mn), Co, chromium (Cr), titanium nitride (TiN), titanium tungsten (TiW), tantalum (Ta), tantalum nitride, tungsten nitride (WN), and combinations thereof. Other suitable materials are within the contemplated scope of the present disclosure. The barrier layer may be deposited by a suitable process, for example but not limited to, CVD or ALD.

A planarization treatment (for example, chemical mechanical planarization (CMP)) is then performed to remove excess of the first electrically conductive material, so as to form the first electrically conductive features 17.

Referring to FIG. 1, the method 100 then proceeds to block 104 where a cap layer and a second low-k dielectric layer are sequentially deposited. Referring to the example illustrated in FIG. 5, a cap layer 18 and a second low-k dielectric layer 19 are sequentially deposited on the first electrically conductive features 17 and the first low-k dielectric layer 15 (i.e., on the first interconnect structure (Mx)). In some embodiments, the cap layer 18 may include, for example but not limited to, silicon oxide, silicon nitride, silicon carbide, silicon oxycarbide, silicon oxynitride, silicon carbonitride, silicon oxycarbonitride, polyorganosiloxane (SiOxCyHz), aluminum oxide, aluminum nitride, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, or combinations thereof. Other suitable materials are within the contemplated scope of the present disclosure. The deposition of the cap layer 18 may be performed by a suitable deposition process as is known to those skilled in the art of semiconductor fabrication, for example but not limited to, PVD, CVD, PECVD, ALD, or PEALD. The cap layer 18 may have a thickness ranging from 1 Å to 500 Å. In some embodiments, the cap layer 18 may act as an etch stop layer.

Figure 7:
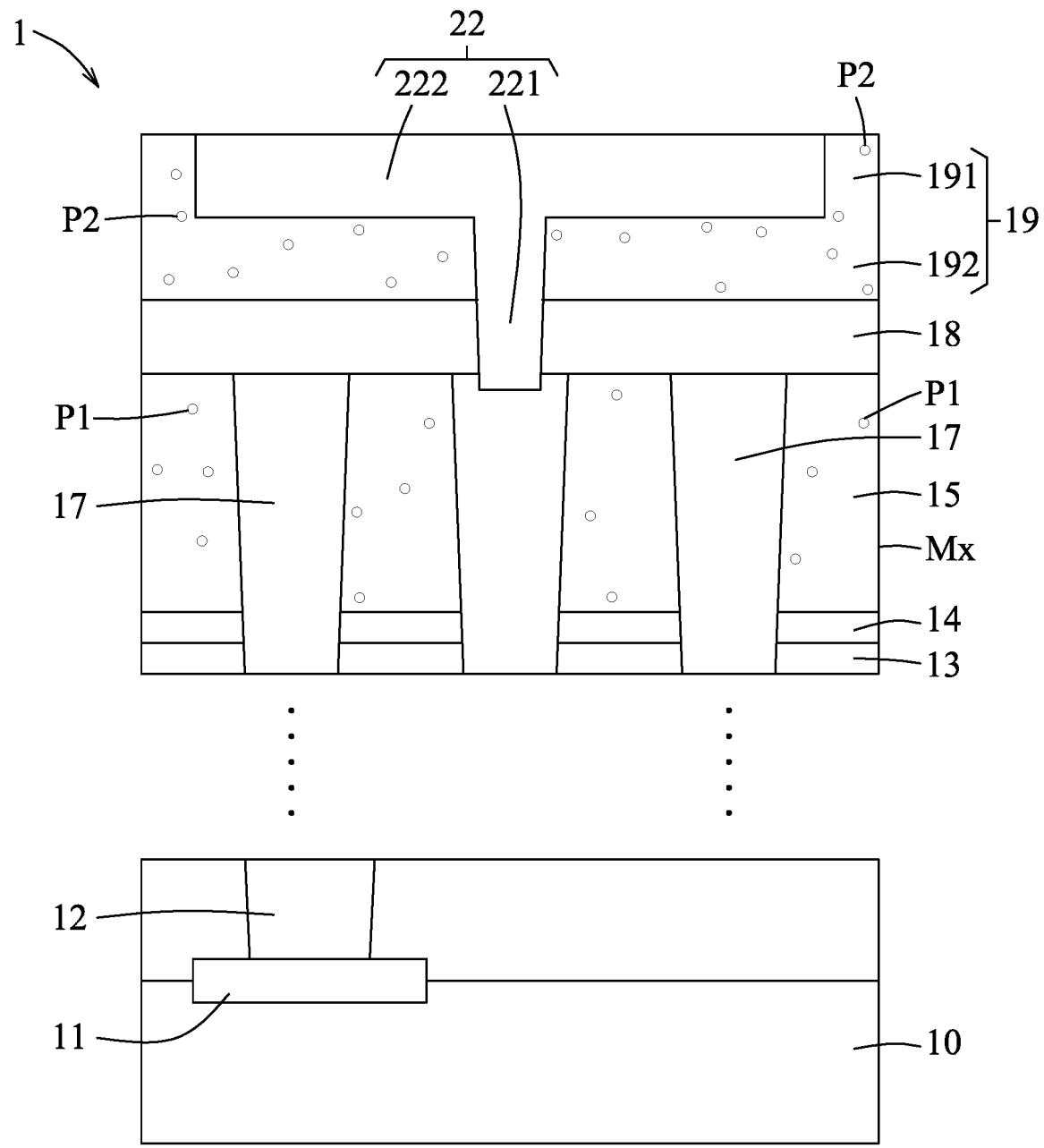

The second low-k dielectric layer 19 is used as an ILD layer in a second damascene process (a dual damascene process) for forming a second interconnect structure (i.e., a multi-level conductive structure as shown in FIG. 7), and may be the same as or similar to the first low-k dielectric layer 15. The second low-k dielectric layer 19 may include a low-k dielectric material which generally has a dielectric constant (k value) of less than 3.5. In some embodiments, the low-k dielectric material may include, for example but not limited to, a carbon-containing dielectric material. In some embodiments, the carbon-containing dielectric material may include, for example but not limited to, a carbon-containing silicon oxide dielectric material. Other suitable materials are within the contemplated scope of the present disclosure. Deposition of the second low-k dielectric layer 19 may be performed by a suitable deposition process as is known to those skilled in the art of semiconductor fabrication, for example but not limited to, CVD, PECVD, ALD, PEALD, or spin-coating. The second low-k dielectric layer 19 may have a thickness ranging from about 10 Å to 50 Å.

Referring to FIG. 1, the method 100 then proceeds to block 105, where a trench and a via opening are formed in the second low-k dielectric layer. Referring to the examples illustrated in FIGS. 5 and 6, the second low-k dielectric layer 19 is patterned by two etching processes, each of which may be performed by, for example but not limited to, dry etching through a pattern opening of a patterned mask layer (not shown) to form a patterned low-k dielectric layer. The second low-k dielectric layer 19 is thus formed with a recess including a trench 20 and a via opening 21. The trench 20 extends through an upper portion 191 of the second low-k dielectric layer 19. The via opening 21 extends through a lower portion 192 of the second low-k dielectric layer 19, and is disposed below and spatially communicated with the trench 20 so as to expose a corresponding one of the first electrically conductive features 17.

Referring to FIG. 1, the method 100 then proceeds to block 106 where a second electrically conductive feature is formed. Referring to the examples illustrated in FIGS. 6 and 7, the trench 20 and the via opening 21 are filled with a second electrically conductive material, and a planarization treatment (for example, CMP) is then performed to remove excess of the second electrically conductive material to form a second electrically conductive feature 22. The second electrically conductive feature 22 includes a lower electrically conductive sub-feature 221 and an upper electrically conductive sub-feature 222. The lower electrically conductive sub-feature 221 is used as an electrically conductive via, and is disposed in the lower portion 192 of the second low-k dielectric layer 19 and electrically connected to the corresponding one of the first electrically conductive features 17. The upper electrically conductive sub-feature 222 is used as a metal line, and is disposed in the upper portion 191 of the second low-k dielectric layer 19 and connected to the lower electrically conductive sub-feature 221.

Details regarding the material and the formation of the second electrically conductive feature 22 are the same as or similar to those of the first electrically conductive features 17 described above with reference to FIGS. 3 and 4. In addition, similarly to that described above with reference to FIGS. 3 and 4, before filling the trench 20 and the via opening 21 with copper or the like, the trench 20 and the via opening 21 may be lined with a barrier layer (not shown) that prevents electromigration.

A low-k dielectric material can be used in a damascene process and a metal reactive-ion-etching (RIE) process. It is known that the dry etch rate of an ILD material containing carbon varies as a function of carbon content, and it is also known that when the carbon content of the ILD material is too low, an ILD layer thus formed may be liable to severe etch damage during or after a dry etching process. Therefore, it is known to use a low-k dielectric material having a sufficient high carbon content (for example, at least about 16 atomic % (atomic percent)) to form the ILD layer. In addition, in order to increase the resistance of the low-k dielectric material to processing damage during or after an etching process, it is usually desirable in the art to raise the carbon content of the low-k dielectric material as high as possible.

It is found by the research of the inventors that when the carbon content of the low-k dielectric material is higher than a certain value, the ILD layer made of the low-k dielectric material may have an excessive high porosity, which may lead to severe etch damage during or after an etching process.

The ILD layer may be formed by CVD or PECVD in a chemical deposition chamber. Selected precursors used in CVD or PECVD are introduced into the chemical deposition chamber, for example, through a suitable manifold system from various precursor supply reservoirs, which may be controlled by valves. In addition, plasma energy may be supplied to the chemical deposition chamber through a radio frequency (RF) generator to enhance the deposition process.

Figure 2:
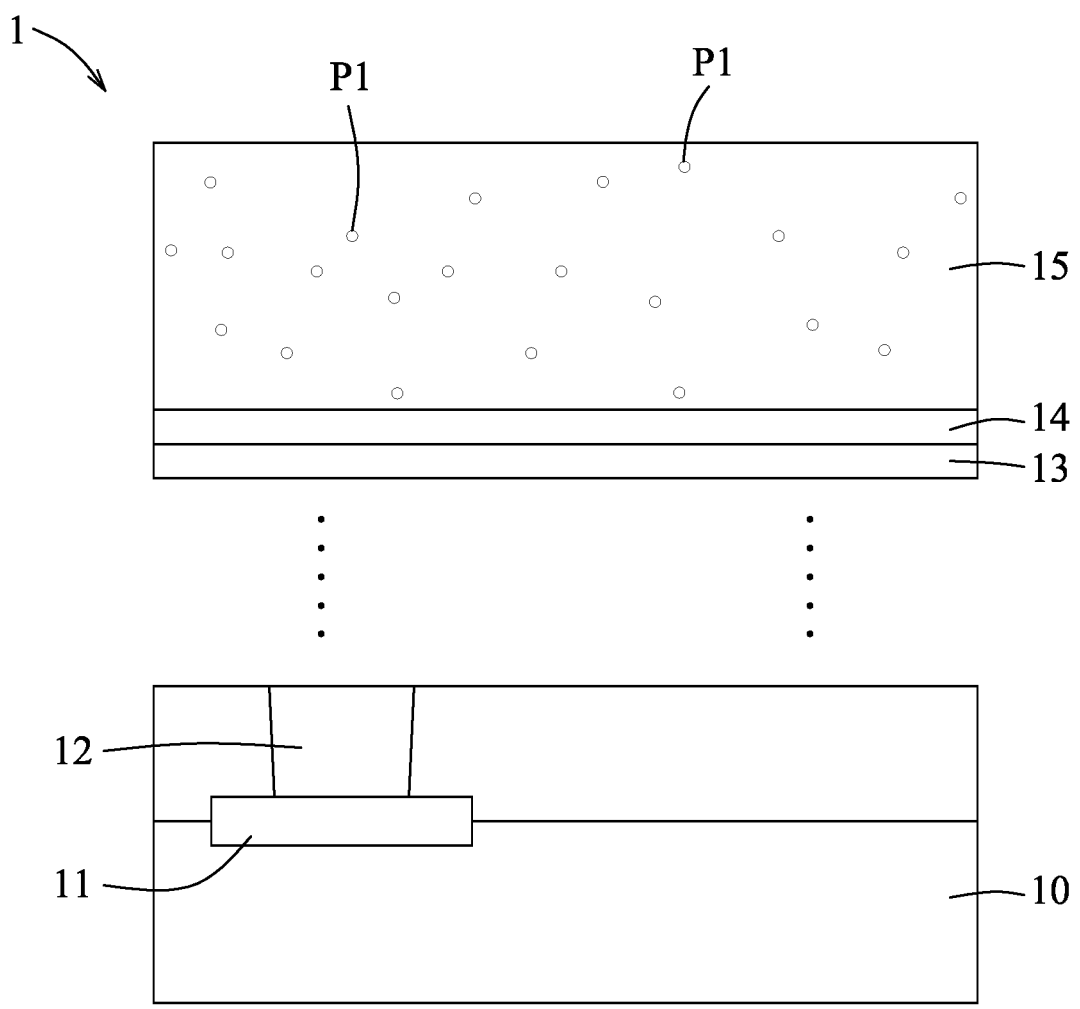
FIGS. 2 to 7 illustrate schematic views showing intermediate stages of the method depicted in FIG. 1.
Figure 5:
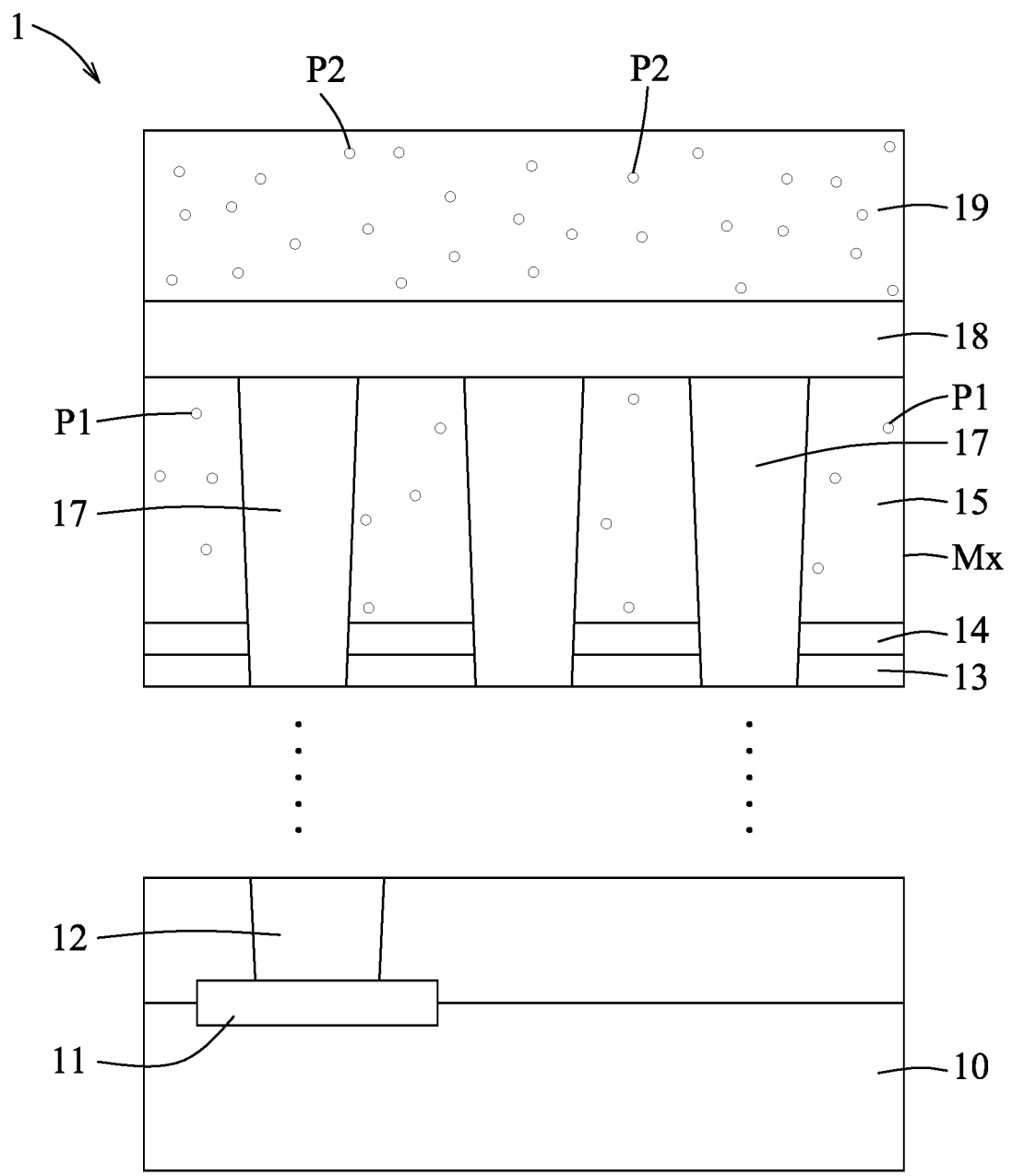
Figure 6:
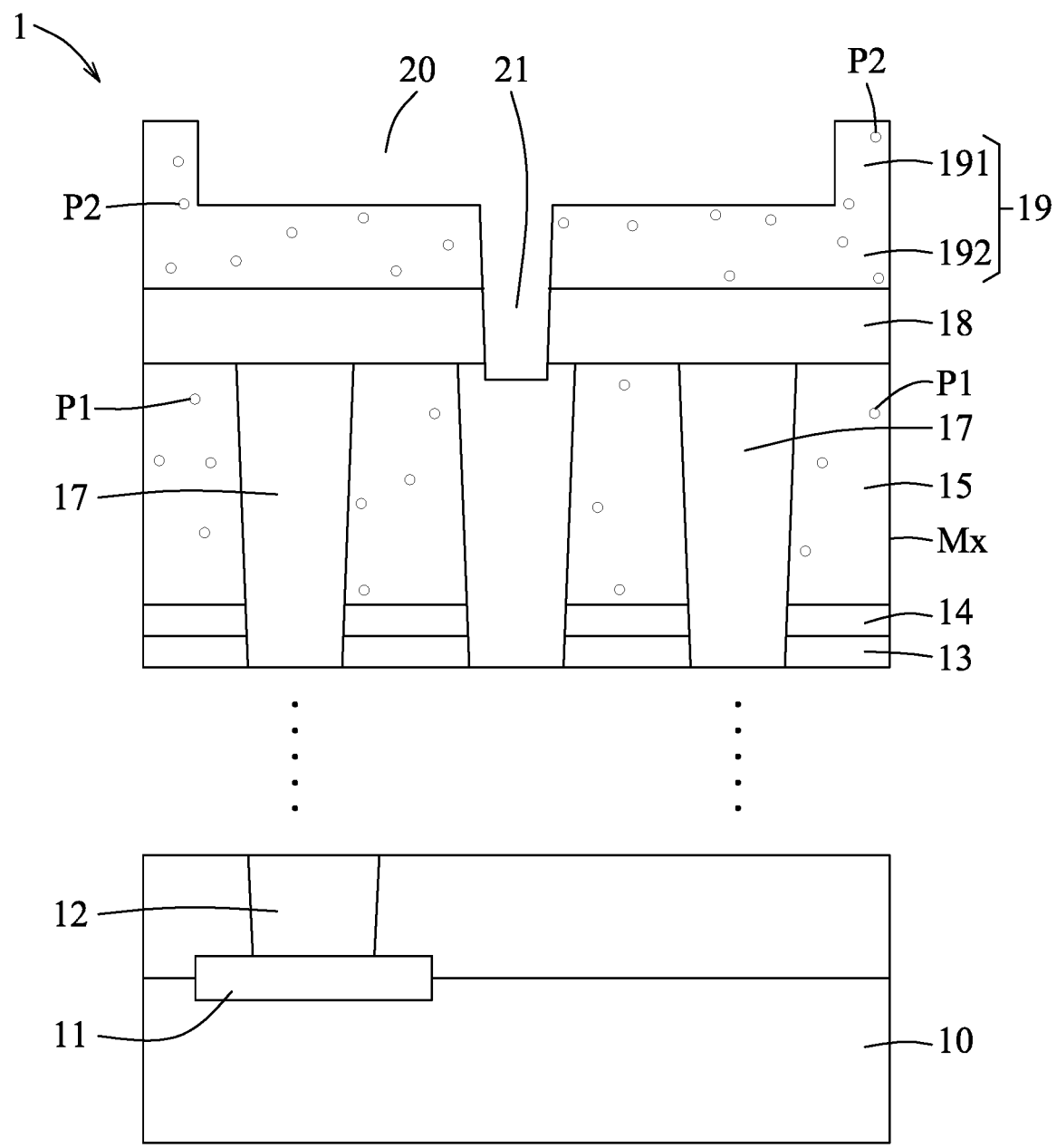

Referring to the examples illustrated in FIGS. 2 and 5, in some embodiments, the low-k carbon-containing silicon oxide dielectric materials of the first and second low-k dielectric layers 15, 19 (the ILD layers) of the semiconductor device 1 are formed using a precursor mixture by PECVD in a chemical deposition chamber. The first and second low-k dielectric layers 15, 19 thus formed may generate pores (P1, P2) therein, respectively. A first precursor in the precursor mixture is used as a silicon-containing precursor or a silicon and carbon-containing precursor, and includes, for example but not limited to, silanes, alkylsilanes, alkoxysilanes, linear siloxanes, cyclic siloxanes, or combinations thereof.

In some embodiments, silanes include, for example but not limited, silane ($SiH_4$), disilane ($Si_2H_6$), and trisilane ($Si_3H_8$). Alkylsilanes include, for example but not limited to, methylsilane, dimethylsilane, trimethylsilane and tetramethylsilane. Alkoxysilanes include, for example but not limited to, methyldiethoxy silane, methyltri ethoxysilane, methyltrimethoxysilane, methyldimethoxysilane, trimethylmethoxysilane, and dimethyldimethoxysilane.

In some embodiments, linear siloxanes include, for example but not limited to, linear siloxane compounds represented by Formula I:

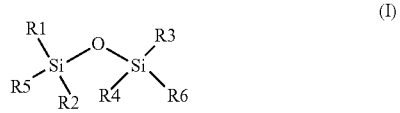

(I)

wherein

R1, R2, R3, R4, R5, and R6 independently represent hydrogen, methyl, ethyl, n-propyl, i-propyl, vinyl, allyl, methylallyl, or phenyl.

In some embodiments, linear siloxanes include, for example but not limited, di siloxane, hexamethyldisiloxane, hexaethyldisiloxane, hexapropyldisiloxane, methylpentaethyldisiloxane, dimethyltetraethyldisiloxane, trimethyltriethyldisilosane, tetramethyldiethyldisiloxane, pentamethylethyldisiloxane, tetramethyldivinyldisiloxane, tetraethyldivinyldisiloxane, tetrapropyldivinyldisiloxane, tetramethyldiallyldisiloxane, tetraethyldiallyldisiloxane, tetrapropyldiallyldisiloxane, and combinations thereof. Other suitable materials are within the contemplated scope of the present disclosure.

In some embodiments, cyclic siloxanes include, for example but not limited to, octamethyl cyclotetrasiloxane, octaethylcyclotetrasiloxane, octapropylcyclotetrasiloxane, octaisopropylcyclotetrasiloxane, methylheptaethylcyclotetrasiloxane, dimethylhexaethylcyclotetrasiloxane, trimethylpentaethylcyclotetrasiloxane, tetramethyltetraethylcyclotetrasiloxane, pentamethyltriethylcyclotetrasiloxane, hexamethyldiethylcyclotetrasiloxane, heptamethylethylcyclotetrasiloxane, and combinations thereof. Other suitable materials are within the contemplated scope of the present disclosure.

A second precursor in the precursor mixture is used as an oxygen-containing precursor, and includes, for example but not limited to, $O_2$, $H_2O$, $D_2O$, $O_3$, and combinations thereof. Other suitable materials are within the contemplated scope of the present disclosure.

In some embodiments, when silanes such as silane and disilane (a silicon-containing precursor) is used as the first precursor, the precursor mixture further includes a third precursor which is used as a carbon-containing precursor. The third precursor includes, for example but not limited, alkanes (for example, methane, ethane, and propane), aklenes (for example, ethene and propene), and carbon dixode ($CO_2$). Other suitable materials are within the contemplated scope of the present disclosure.

A carrier gas (for example, a helium gas) is used to deliver the precursors into the chemical deposition chamber. In some embodiments, the carrier gas is used to deliver the first precursor into the chemical deposition chamber.

An ILD layer having a desirable k value may be obtained by controlling the operating conditions for the deposition process. For example, when a pressure in the chemical deposition chamber is decreased, the k value of the ILD layer thus formed is increased. When a plasma power for PECVD is increased, the k value of the ILD layer thus formed is increased.

In some embodiments, in which the first and second low-k dielectric layers 15, 19 having a substantially constant k value ranging from about 2.8 to about 3.3 are to be formed by PECVD, a flow rate of the first precursor may range from about 400 sccm (standard cubic centimeters per minute) to about 800 sccm. A flow rate of the second precursor may range from about 20 sccm to about 50 sccm. A flow rate of the third precursor may range from about 20 sccm to about 100 sccm. A flow rate of the carrier gas may range from about 500 sccm to about 2,000 sccm. A ratio value of the flow rate of the carrier gas to the flow rate of the first precursor ranges from about 1 to about 5. A pressure in the chemical deposition chamber may be maintained in a range from about 7.5 Torr to about 12 Torr by adjusting the flow rate of the carrier gas. A temperature in the chemical deposition chamber for performing the deposition process ranges from room temperature to about 400° C. A process time for performing PECVD may range from about 150 sec (seconds) to about 250 sec. A RF power of a RF generator may range from about 7.5 W to about 12 W.

When the flow rate of the first precursor containing carbon (e.g., alkylsilanes, alkoxysilanes, or combinations thereof) is greater than an upper limit of the range defined above, the carbon content of the first and second low-k dielectric layers 15, 19 thus formed is too high, which may result in etch damage during or after an etching process. On the other hand, when the flow rate of the first precursor containing carbon is less than a lower limit of the range defined above, the carbon content of the first and second low-k dielectric layers 15, 19 thus formed is too low, which may also result in etch damage during or after an etching process.

When the flow rate of the second precursor (i.e., the oxygen-containing precursor) is greater than an upper limit of the range defined above, the carbon content of the first and second low-k dielectric layers 15, 19 thus formed is too low, which may result in etch damage during or after an etching process. On the other hand, when the flow rate of the second precursor is less than a lower limit of the range defined above, the carbon content of the first and second low-k dielectric layers 15, 19 thus formed is too high, which may also result in etch damage during or after an etching process.

When the flow rate of the third precursor (i.e., the carbon-containing precursor) is greater than an upper limit of the range defined above, the carbon content of the first and second low-k dielectric layers 15, 19 thus formed is too high, which may result in etch damage during or after an etching process. On the other hand, when the flow rate of the third precursor is less than a lower limit of the range defined above, the carbon content of the first and second low-k dielectric layers 15, 19 thus formed is too low, which may also result in etch damage during or after an etching process.

When the flow rate of the carrier gas is greater than an upper limit of the range defined above, the carbon content of the first and second low-k dielectric layers 15, 19 thus formed is too low, which may result in etch damage during or after an etching process. On the other hand, when the flow rate of the carrier gas is less than a lower limit of the range defined above, the carbon content of the first and second low-k dielectric layers 15, 19 thus formed is too high, which may also result in etch damage during or after an etching process.

When the ratio value of the flow rate of the carrier gas to the flow rate of the first precursor containing carbon is greater than an upper limit of the range defined above, the carbon content of the first and second low-k dielectric layers 15, 19 thus formed is too low, which may result in etch damage during or after an etching process. On the other hand, when the ratio value of the flow rate of the carrier gas to the flow rate of the first precursor containing carbon is less than a lower limit of the range defined above, the carbon content of the first and second low-k dielectric layers 15, 19 thus formed is too high, which may also result in etch damage during or after an etching process.

When the pressure in the chemical deposition chamber is greater than an upper limit of the range defined above, the carbon content of the first and second low-k dielectric layers 15, 19 thus formed is too high, which may result in etch damage during or after an etching process. On the other hand, when the pressure in the chemical deposition chamber is less than a lower limit of the range defined above, the carbon content of the first and second low-k dielectric layers 15, 19 thus formed is too low, which may also result in etch damage during or after an etching process.

When the temperature in the chemical deposition chamber is greater than an upper limit of the range defined above, the conductive features (e.g., metal lines) in the semiconductor deice 1 may be damaged during a back-end-of-line process.

The process time for performing PECVD may be adjusted according to the thickness of the first and second low-k dielectric layers 15, 19 to be formed.

When the RF power is greater than an upper limit of the range defined above, the k value of the first and second low-k dielectric layers 15, 19 thus formed is too high. On the other hand, when the RF power is less than a lower limit of the range defined above, the reaction for forming the first and second low-k dielectric layers 15, 19 may be incomplete, which may result in defects in the first and second low-k dielectric layers 15, 19 thus formed.

In some embodiments, in which the first and second low-k dielectric layers 15, 19 having a substantially constant k value ranging from about 3.0 to about 3.2 are to be formed by PECVD, the flow rate of the first precursor may range from about 500 sccm to about 600 sccm. The flow rate of the second precursor may range from about 30 sccm to about 40 sccm. The flow rate of the third precursor may range from about 40 sccm to about 70 sccm. The flow rate of the carrier gas may range from about 800 sccm to about 1,500 sccm. The ratio value of the flow rate of the carrier gas to the flow rate of the first precursor ranges from about 2 to about 4. The pressure in the chemical deposition chamber may be maintained in a range from about 9 Torr to about 10 Torr by adjusting the flow rate of the carrier gas. The temperature in the chemical deposition chamber for performing the deposition process ranges from about 200° C. to about 400° C. The process time for performing PECVD may range from about 180 sec to about 230 sec. The RF power of the RF generator may range from about 8.0 W to about 9.0 W.

Low-k carbon-containing silicon oxide dielectric materials which had a similar k value and various carbon contents are used to form the first and second low-k dielectric layers 15, 19 (the ILD layers) of the semiconductor device 1 described above. The ILD layers are formed through PECVD in the chemical deposition chamber, followed by ultraviolet (UV) curing. The k value and the carbon content of the ILD layers, the porosity and the roughness of the ILD layers after a dry etching process, and the leakage current density of semiconductor devices including the ILD layers after the dry etching process are measured by the methods described below.

1. Dielectric constant (k value):

The dielectric constant (k value) of an ILD layer is measured at room temperature through capacitance-voltage (C-V) measurement using an Hg probe.

2. Carbon content (atomic %):

The carbon content of the ILD layer is measured at room temperature by an X-ray photoelectron Spectroscopy (XPS) analysis.

3. Porosity (%):

The porosity of the ILD layer before and after a dry etching process using a nitrogen trifluoride ($NF_3$) etch gas is measured at room temperature through an ellipsometric porosimetry (EP) analysis.

4. Roughness (Å):

The roughness of the ILD layer after the dry etching process is measured at room temperature by an atomic force microscopy (AMF) analysis.

5. Leakage current density ($A/cm^2$):

The leakage current density of a semiconductor device including the ILD layer after the dry etching process is measured at room temperature through current-voltage (I-V) measurement at an electric field of 2 MV/cm using an Hg probe.

Figure 8:
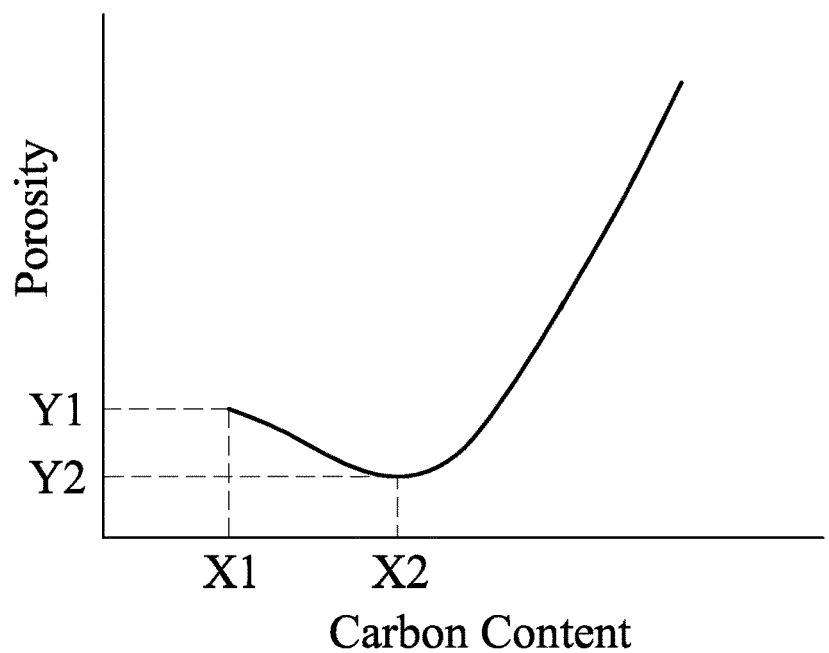
FIG. 8 illustrates a graph showing a relationship between a porosity of an ILD layer in the semiconductor device after a dry etching process and a carbon content of the ILD layer.
Figure 9:
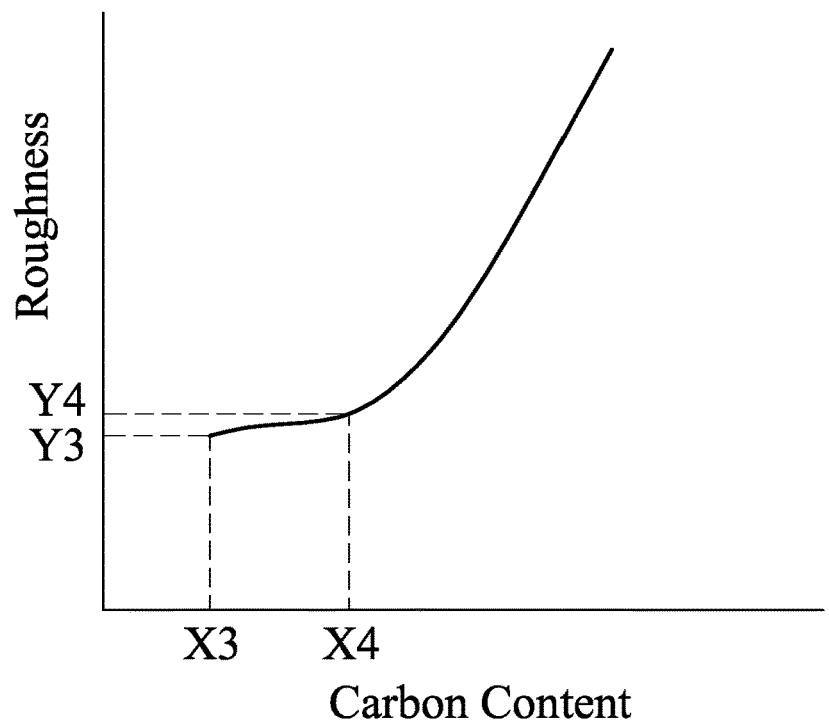
FIG. 9 illustrates a graph shown a relationship between a roughness of the ILD layer after the dry etching process and the carbon content of the ILD layer.
Figure 10:
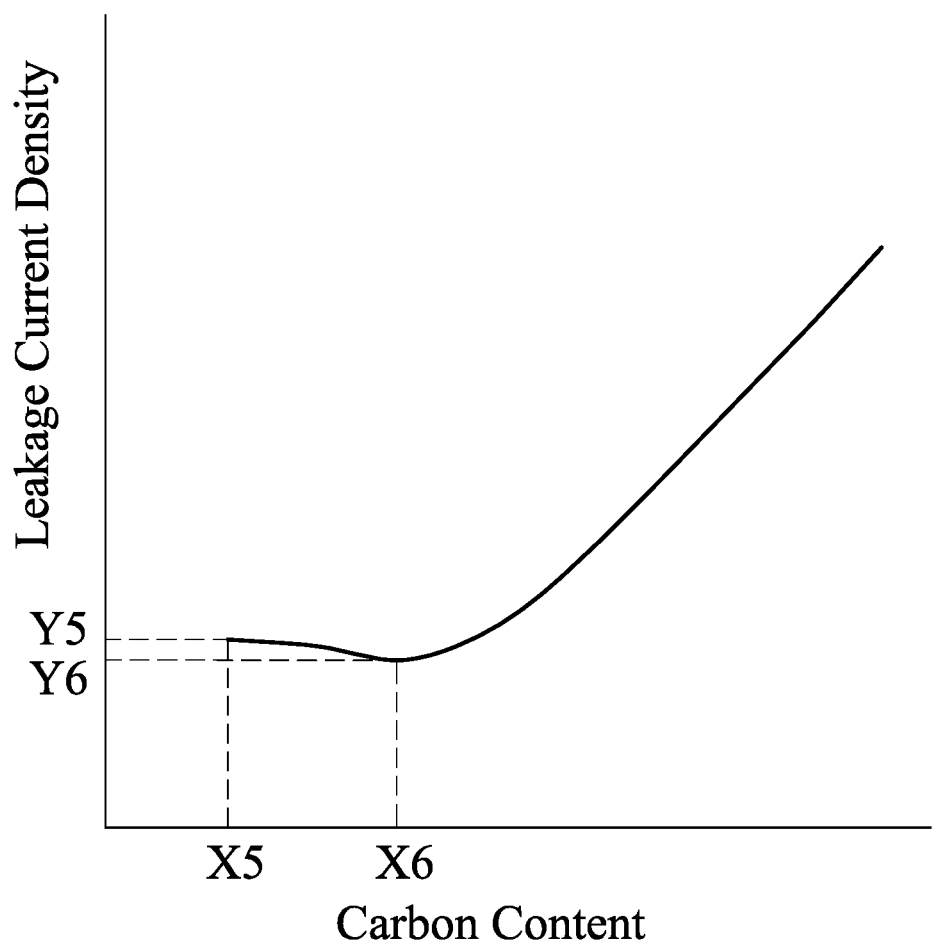
FIG. 10 illustrates a graph shown a relationship between a leakage current density of a semiconductor device including the ILD layer after the dry etching process and the carbon content of the ILD layer.

Graphs showing a relationship between the porosity of the ILD layer after the dry etching process and the carbon content of the ILD layer, a relationship between the roughness of the ILD layer after the dry etching process and the carbon content of the ILD layer, and a relationship between the leakage current density of a semiconductor device including the ILD layer after the dry etching process and the carbon content of the ILD layer are shown in FIGS. 8 to 10, respectively.

As described above, it is found by the research of the inventors that when the carbon content of the low-k dielectric material is higher than a certain value, the ILD layer made of the low-k dielectric material may have an excessive high porosity, which may lead to severe etch damage during or after an etching process. In some embodiments in which the first and second low-k dielectric layers 15, 19 having a substantially constant k value ranging from about 2.8 to about 3.3 are formed by PECVD, the first and second low-k dielectric layers 15, 19 includes a carbon-containing dielectric material having a carbon content which is controlled to be in a range from 16 atomic % to 23 atomic %. In some embodiments, the carbon content of the carbon-containing dielectric material of the first and second low-k dielectric layers 15, 19 is to be controlled in a range from 18 atomic % to 22 atomic %. In some embodiments, the carbon content of the carbon-containing dielectric material of the first and second low-k dielectric layers 15, 19 is controlled to be in a range from 19 atomic % to 21 atomic %. The first and second low-k dielectric layers 15, 19 (ILD layers) thus form before the dry etching process for forming the trenches 16, 21 and the via opening 21 have a porosity ranging from 0.03% to 1.0%. In some embodiments, the porosity of the ILD layer before the dry etching process ranges from 0.03% to 0.1%. When the porosity of the ILD layer is greater than an upper limit of the range, the k value of the ILD layer is too low and etch damage may occur during or after an etching process.

Referring to the result shown in FIG. 8, when the carbon content of the carbon-containing dielectric material of the ILD layer is higher than an upper limit of the range defined above, the porosity of the ILD layer after the dry etching process is significantly increased. In some embodiments, when the carbon content of the carbon-containing dielectric material of the ILD layer having a k value ranging from about 2.8 to about 3.3 is in the ranges defined above, the ILD layer can be prevented from etch damage during the dry etching process and the porosity of the ILD layer after the dry etching process is maintained in a range from 1.0% to 2.0%.

Referring to the result shown in FIG. 9, when the carbon content of the carbon-containing dielectric material of the ILD layer is higher than the upper limit of the range defined above, the roughness of the ILD layer after the dry etching process is significantly increased. In some embodiments, when the carbon content of the carbon-containing dielectric material of the ILD layer having a k value ranging from about 2.8 to about 3.3 is in the ranges defined above, the ILD layer can be prevented from etch damage during the dry etching process and the roughness of the ILD layer after the dry etching process is maintained in a range from 1.0 Å to 2.0 Å.

Referring to the result shown in FIG. 10, when the carbon content of the carbon-containing dielectric material of the ILD layer is higher than the upper limit of the range defined above, the leakage current density of the semiconductor device including the ILD layer after the dry etching process is significantly increased. In some embodiments, when the carbon content of the carbon-containing dielectric material of the ILD layer having a k value ranging from about 2.8 to about 3.3 is in the ranges defined above, the ILD layer can be prevented from etch damage during the dry etching process and the leakage current density of the semiconductor device including the ILD layer after the dry etching process is maintained in a range from $1.0 \times 10^{-8}$ A/cm$^2$ to $9.9 \times 10^{-7}$ A/cm$^2$.

As described above, in order to increase the resistance of the low-k dielectric material containing carbon to processing damage during or after an etching process, it is usually in the art to raise the carbon content of the low-k dielectric material as high as possible. However, it is found by the inventors that when the carbon content of the low-k dielectric material (for example, the low-k carbon-containing silicon oxide dielectric material) for the ILD layer is higher than the upper limit of the range described above, the roughness and porosity of the ILD layer after the dry etching process are raised significantly, and the leakage current density of a semiconductor device including the ILD layer after the dry etching process is unexpectedly increased. An ILD layer of a semiconductor device of the disclosure includes a carbon-containing dielectric material having a carbon content which is controlled to be in the range defined above, so that the roughness and porosity of the ILD layer after the dry etching process are not raised significantly, and the leakage current density of the semiconductor device including the ILD layer after the dry etching process is not undesirably increased.

In accordance with some embodiments of the present disclosure, a method for manufacturing a semiconductor device having a low-k carbon-containing dielectric layer includes: depositing a low-k carbon-containing dielectric material, which has a carbon content ranging from 16 atomic % to 23 atomic %, using a precursor mixture to form a carbon-containing dielectric layer having a k value ranging from 2.8 to 3.3 and a porosity ranging from 0.03% to 1.0%; forming the carbon-containing dielectric layer into a patterned carbon-containing dielectric layer having a recess therein by etching, the patterned carbon-containing dielectric layer having a porosity ranging from 1.0% to 2.0%; and filling the recess with an electrically conductive material to form an electrically conductive feature in the patterned carbon-containing dielectric layer.

In accordance with some embodiments of the present disclosure, the patterned carbon-containing dielectric layer has a roughness ranging from 1.0 Å to 2.0 Å.

In accordance with some embodiments of the present disclosure, the low-k carbon-containing dielectric material is a low-k carbon-containing silicon oxide dielectric material.

In accordance with some embodiments of the present disclosure, the precursor mixture includes a first precursor used as a silicon and carbon-containing precursor; and a second precursor used as an oxygen-containing precursor.

In accordance with some embodiments of the present disclosure, a flow rate of the first precursor ranges from 400 sccm to 800 sccm.

In accordance with some embodiments of the present disclosure, the precursor mixture includes a first precursor used as a silicon-containing precursor; a second precursor used as an oxygen-containing precursor; and a third precursor used as a carbon-containing precursor.

In accordance with some embodiments of the present disclosure, a flow rate of the third precursor ranges from 20 sccm to 100 sccm.

In accordance with some embodiments of the present disclosure, depositing the low-k carbon-containing dielectric material is conducted at a pressure ranging from 7.5 Torr to 12 Torr.

In accordance with some embodiments of the present disclosure, depositing the low-k carbon-containing dielectric material is conducted at a radio frequency (RF) power ranging from 7.5 W to 12 W.

In accordance with some embodiments of the present disclosure, a method for manufacturing a semiconductor device having a low-k carbon-containing dielectric layer includes: depositing a low-k carbon-containing dielectric material, which has a carbon content ranging from 16 atomic % to 23 atomic %, using a precursor mixture and a carrier gas to form a carbon-containing dielectric dielectric layer having a k value ranging from 2.8 to 3.3 and a porosity ranging from 0.03% to 1.0%, the precursor mixture including a first precursor used as a silicon and carbon-containing precursor and a second precursor used as an oxygen-containing precursor; forming the carbon-containing dielectric layer into a patterned carbon-containing dielectric layer having a recess therein by etching, the patterned carbon-containing dielectric layer having a porosity ranging from 1.0% to 2.0%; and filling the recess with an electrically conductive material to form an electrically conductive feature in the patterned carbon-containing dielectric layer.

In accordance with some embodiments of the present disclosure, the patterned carbon-containing dielectric layer has a roughness ranging from 1.0 Å to 2.0 Å.

In accordance with some embodiments of the present disclosure, a flow rate of the first precursor ranges from 400 sccm to 800 sccm.

In accordance with some embodiments of the present disclosure, a flow rate of the carrier gas ranges from 500 sccm to 2,000 sccm.

In accordance with some embodiments of the present disclosure, a ratio value of a flow rate of the carrier gas to a flow rate of the first precursor ranges from 1 to 5.

In accordance with some embodiments of the present disclosure, depositing the low-k carbon-containing dielectric material is conducted at a pressure ranging from 7.5 Torr to 12 Torr.

In accordance with some embodiments of the present disclosure, depositing the low-k carbon-containing dielectric material is conducted at a RF power ranging from 7.5 W to 12 W.

In accordance with some embodiments of the present disclosure, a method for manufacturing a semiconductor device having a low-k carbon-containing dielectric layer includes: depositing a low-k carbon-containing dielectric material, which has a carbon content ranging from 16 atomic % to 23 atomic %, using a precursor mixture and a carrier gas to form a carbon-containing dielectric layer having a k value ranging from 2.8 to 3.3 and a porosity ranging from 0.03% to 1.0%, the precursor mixture including a first precursor used as a silicon-containing precursor, a second precursor used as an oxygen-containing precursor, and a third precursor used as a carbon-containing precursor; forming the carbon-containing dielectric layer into a patterned carbon-containing dielectric layer having a recess therein by etching, the patterned carbon-containing dielectric layer having a porosity ranging from 1.0% to 2.0%; and filling the recess with an electrically conductive material to form an electrically conductive feature in the patterned carbon-containing dielectric layer.

In accordance with some embodiments of the present disclosure, the patterned carbon-containing dielectric layer has a roughness ranging from 1.0 Å to 2.0 Å.

In accordance with some embodiments of the present disclosure, a flow rate of the third precursor ranges from 20 sccm to 100 sccm.

In accordance with some embodiments of the present disclosure, a flow rate of the carrier gas ranges from 500 sccm to 2,000 sccm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device having a low-k carbon-containing dielectric layer, comprising:
   depositing a low-k carbon-containing dielectric material, which has a carbon content ranging from 16 atomic % to 23 atomic %, using a precursor mixture to form a carbon-containing dielectric layer having a k value ranging from 2.8 to 3.3 and a porosity ranging from 0.03% to 1.0%;
   forming the carbon-containing dielectric layer into a patterned carbon-containing dielectric layer having a recess therein by etching, the patterned carbon-containing dielectric layer having a porosity ranging from 1.0% to 2.0%; and
   filling the recess with an electrically conductive material to form an electrically conductive feature in the patterned carbon-containing dielectric layer.

2. The method according to claim 1, wherein the patterned carbon-containing dielectric layer has a roughness ranging from 1.0 Å to 2.0 Å.

3. The method according to claim 1, wherein the low-k carbon-containing dielectric material is a low-k carbon-containing silicon oxide dielectric material.

4. The method according to claim 3, wherein the precursor mixture includes:
   a first precursor used as a silicon and carbon-containing precursor; and
   a second precursor used as an oxygen-containing precursor.

5. The method according to claim 4, wherein a flow rate of the first precursor ranges from 400 sccm (standard cubic centimeters per minute) to 800 sccm.

6. The method according to claim 3, wherein the precursor mixture includes:
   a first precursor used as a silicon-containing precursor;
   a second precursor used as an oxygen-containing precursor; and
   a third precursor used as a carbon-containing precursor.

7. The method according to claim 6, wherein a flow rate of the third precursor ranges from 20 sccm to 100 sccm.

8. The method according to claim 1, wherein depositing the low-k carbon-containing dielectric material is conducted at a pressure ranging from 7.5 Torr to 12 Torr.

9. The method according to claim 1, wherein depositing the low-k carbon-containing dielectric material is conducted at a radio frequency (RF) power ranging from 7.5 W to 12 W.

10. A method for manufacturing a semiconductor device having a low-k carbon-containing dielectric layer, comprising:
    depositing a low-k carbon-containing dielectric material, which has a carbon content ranging from 16 atomic % to 23 atomic %, using a precursor mixture and a carrier gas to form a carbon-containing dielectric layer having a k value ranging from 2.8 to 3.3 and a porosity ranging from 0.03% to 1.0%, the precursor mixture including a first precursor used as a silicon and carbon-containing precursor and a second precursor used as an oxygen-containing precursor;
    forming the carbon-containing dielectric layer into a patterned carbon-containing dielectric layer having a recess therein by etching, the patterned carbon-containing dielectric layer having a porosity ranging from 1.0% to 2.0%; and
    filling the recess with an electrically conductive material to form an electrically conductive feature in the patterned carbon-containing dielectric layer.

11. The method according to claim 10, wherein the patterned carbon-containing dielectric layer has a roughness ranging from 1.0 Å to 2.0 Å.

12. The method according to claim 10, wherein a flow rate of the first precursor ranges from 400 sccm to 800 sccm.

13. The method according to claim 10, wherein a flow rate of the carrier gas ranges from 500 sccm to 2,000 sccm.

14. The method according to claim 10, wherein a ratio value of a flow rate of the carrier gas to a flow rate of the first precursor ranges from 1 to 5.

15. The method according to claim 10, wherein depositing the low-k carbon-containing dielectric material is conducted at a pressure ranging from 7.5 Torr to 12 Torr.

16. The method according to claim 10, wherein depositing the low-k carbon-containing dielectric material is conducted at a RF power ranging from 7.5 W to 12 W.

17. A method for manufacturing a semiconductor device having a low-k carbon-containing dielectric layer, comprising:

depositing a low-k carbon-containing dielectric material, which has a carbon content ranging from 16 atomic % to 23 atomic %, using a precursor mixture and a carrier gas to form a carbon-containing dielectric layer having a k value ranging from 2.8 to 3.3 and a porosity ranging from 0.03% to 1.0%, the precursor mixture including a first precursor used as a silicon-containing precursor, a second precursor used as an oxygen-containing precursor, and a third precursor used as a carbon-containing precursor;

forming the carbon-containing dielectric layer into a patterned carbon-containing dielectric layer having a recess therein by etching, the patterned carbon-containing dielectric layer having a porosity ranging from 1.0% to 2.0%; and filling the recess with an electrically conductive material to form an electrically conductive feature in the patterned carbon-containing dielectric layer.

18. The method according to claim 17, wherein the patterned carbon-containing dielectric layer has a roughness ranging from 1.0 Å to 2.0 Å.

19. The method according to claim 17, wherein a flow rate of the third precursor ranges from 20 sccm to 100 sccm.

20. The method according to claim 17, wherein a flow rate of the carrier gas ranges from 500 sccm to 2,000 sccm.

* * * * *